United States Patent [19]

Orchard et al.

[11] 3,881,158

[45] Apr. 29, 1975

[54] MULTIPURPOSE ACTIVE FILTER NETWORK

[75] Inventors: Henry J. Orchard, Santa Monica; Charles E. Schmidt, Woodside, both of Calif.

[73] Assignee: GTE Automatic Electric Laboratories Incorporated, Northlake, Ill.

[22] Filed: May 29, 1974

[21] Appl. No.: 474,274

[52] U.S. Cl. .................................. 330/84; 330/107
[51] Int. Cl. .............................................. H03f 1/36
[58] Field of Search ........... 330/21, 31, 28, 84, 107, 330/109; 328/167

[56] References Cited

OTHER PUBLICATIONS

Girling et al., "Active Filters – Some Uses of Amplifiers with Differential Input," Wireless World, December 1970, pp. 613–617.

*Primary Examiner*—James B. Mullins
*Attorney, Agent, or Firm*—Leonard R. Cool; Russell A. Cannon; T. C. Jay, Jr.

[57] ABSTRACT

An active biquadratic filter circuit having a plurality of nodes connected by admittances and including a pair of operational amplifiers and a pair of capacitors connected in a configuration providing optional lowpass, highpass, and allpass filter with certain of said functions being simultaneously obtainable.

18 Claims, 9 Drawing Figures

MULTIPURPOSE ACTIVE FILTER NETWORK

BACKGROUND OF INVENTION

1. Field of Invention

The invention relates to active filters such as used in communications equipment. Such filters may use a general-purpose building block which consists of two operational amplifiers, several resistors, and one or two capacitors. It being an approximate rule of thumb that two amplifiers and a capacitor replace an inductor.

2. Background of Invention

Advances in the design and understanding of active networks have enabled the avoidance of inductors which are bulky and have low Q-factors, especially at low frequencies. Active filters can be designed by any one of several general methods. The most commonly used one first expresses the desired transfer function as a product of biquadratic factors and then realizes the complete filter as a non-interacting tandem connection of so-called biquad sections, each of which has a transfer function equal to one of the biquadratic factors. The other methods all involve a simulation process applied to a conventional filter made with a lossless reciprocal ladder network. In its simplest form the method replaces each inductor in the ladder network by some RC active circuit that simulates the behavior of an inductor. In more elaborate forms the complete filter behavior is simulated on an analog computer and the computer itself is then used as the filter. Recent applications of this method have called for the use of biquad sections in the analog computer.

The biquad filter approach is used when natural-mode Q's are not high, passband tolerances are not extremely tight, and bi-directionality is not required. Biquad filters have the advantages of low cost and standardized packaging and manufacturing. They can be designed to be relatively independent of source and load impedances, and they can easily incorporate gain or loss into the filter. They are also favored by designers who do not have access to computer programs for designing lossless ladder filters and are therefore precluded from using the simulation approach, except in the special case of a catalogued design.

For telephone work in particular, and any time where there is a stringent stopband requirement, it is important to have what is called a transmission zero on the $j\omega$ axis. A filter network that has attenuation poles on the $j\omega$ axis is called a notch filter, the notch being located at the frequency where there is no transmission. In communications circuits, there is sometimes a requirement for the separation of low frequencies and high frequencies into different paths, and simultaneous lowpass and highpass outputs are accordingly useful, particularly when economically supplied by a single filter configuration.

SUMMARY OF INVENTION

The present invention is for a group of active filters, each in the form of a cascade connection of networks having a biquadratic voltage transfer function in a unique configuration providing most efficient filtering with the individual network transfer functions in the form of $(Vin/Vout)=(a_o + a_1 s + s^2/b_o + s^2)$. The term $s$ here represents the complex frequency variable.

The term "lowpass notch" indicates that $a_o<b_o$, and "highpass notch" that $a_o>b_o$.

In this arrangement, the loss poles appear on the $j\omega$ axis. The multipurpose active filter network of the present invention provides the following advantages:

1. The network contains only two capacitors which is the theoretical minimum number for a second degree system.

2. Absolute circuit stability is provided in a two-part network providing individual or simultaneous lowpass and highpass filter outputs.

3. The advantage enumerated in (2) is obtained with a gyrator using two independent active devices.

4. The active devices mentioned in the foregoing may be simple operational amplifiers.

5. The circuit provides uniform configuration for both lowpass and highpass filters to facilitate economy of batch processing.

6. The biquads have low output impedence enabling tandem connection of the networks.

7. All biquads in the filter can use the same wide-tolerance capacitor value throughout with coefficients being adjustable by trimming resistors only.

8. The circuit provides for easy tuning and low sensitivity afforded in part by the fact that the attenuation pole is not the result of a subtraction process, as is the case in obtaining a null by balancing a twin-T.

9. The circuit is universal in the sense that it can be converted into an allpass, notch, lowpass, and highpass, by strapping and adjusting resistor values.

DETAILED DESCRIPTION OF INVENTION

Figure 2:
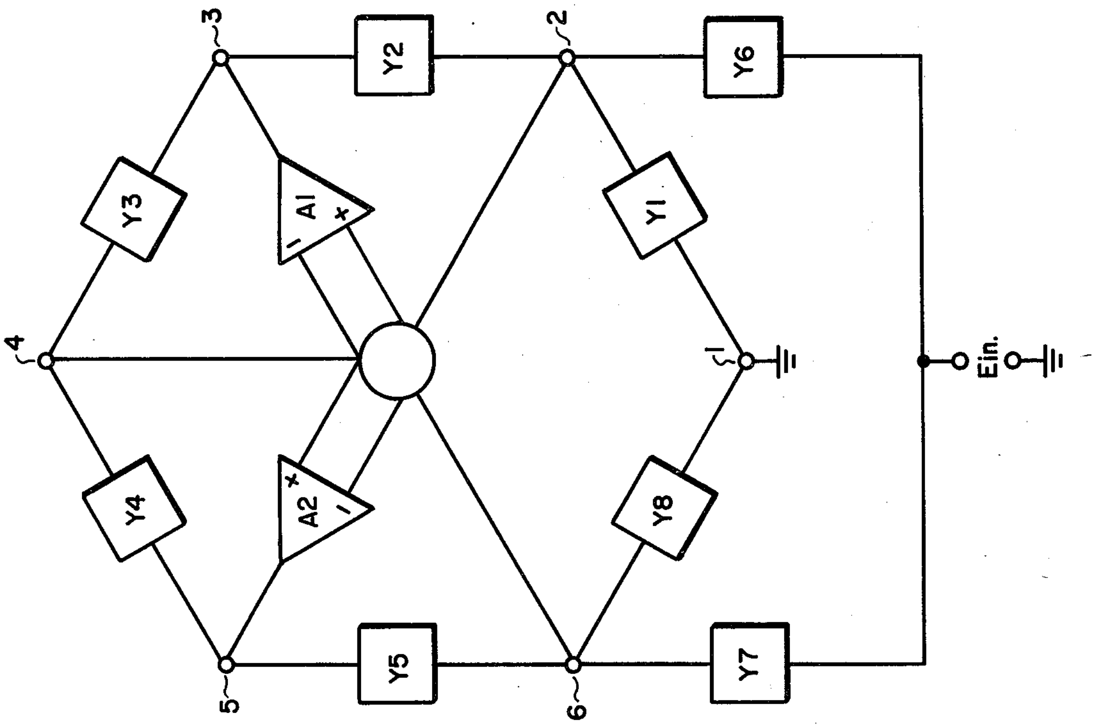
FIG. 2 is a similar generalized version of the filter modified to provide a general non-minimum phase filter.
Figure 1:
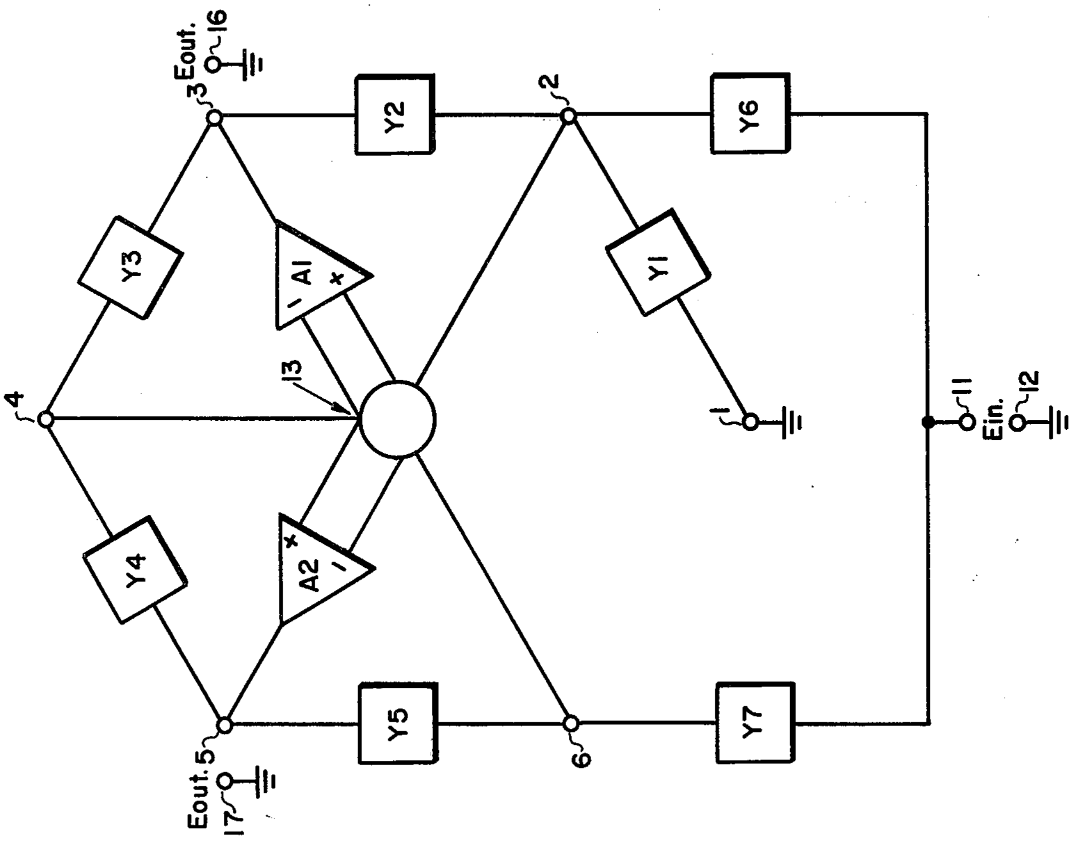
FIG. 1 is a schematic diagram of a generalized version of the multipurpose active filter of the present invention.

The active filter of the present invention comprises briefly a configuration having six nodes labeled in FIG. 1 by numerals 1, 2, 3, 4, 5 and 6; a first admittance, Y1, connected between nodes 1 and 2; a second admittance, Y2, connected between nodes 2 and 3; a third admittance, Y3, connected between nodes 3 and 4; a fourth admittance, Y4, connected between nodes 4 and 5; a fifth admittance, Y5, connected between nodes 5 and 6; a voltage input terminal 11 for input voltage *Ein* having a ground or a common reference terminal 12; a sixith admittance, connected between terminal 11 and node 2; a seventh admittance connected between input terminal 11 and node 6; each of the aforementioned admittances Y1–Y7 comprising an RC two terminal network, i.e., composed of a single capacitor or a single resistor, or a combination of the two; a differential input amplifier A1 having an output connected to node 3; a second differential input amplifier having its output connected to node 5; circuit means 13 connecting the inputs of amplifiers A1 and A2 to nodes 2, 4 and 6; the configuration providing filter output terminals at one of nodes 3 and 5 for filter output voltages Eout, each having a common or ground terminal 16, 17; node 1 being connected to the common reference or ground; and at least two of the admittances Y1–Y7, each containing a capacitor. Differential input amplifiers A1 and A2 each comprise a highgain amplifier with an inverting polarity input and a non-inverting polarity input normally, and here, designated as minus and plus inputs. Each amplifier will also have a low output impedence. These amplifiers may be conventional low-cost operational amplifiers. The present filter will provide all of the above-stated advantages which are not obtained by any other circuit. Among these advantages is the obtaining of the simultaneous lowpass notch output at node 3 and highpass notch at node 5. By the addition of one more admittance Y8 between nodes 1 and 6, as shown in FIG. 2, the configuration will provide a general non-minimum-phase biquadratic filter.

Figure 4:
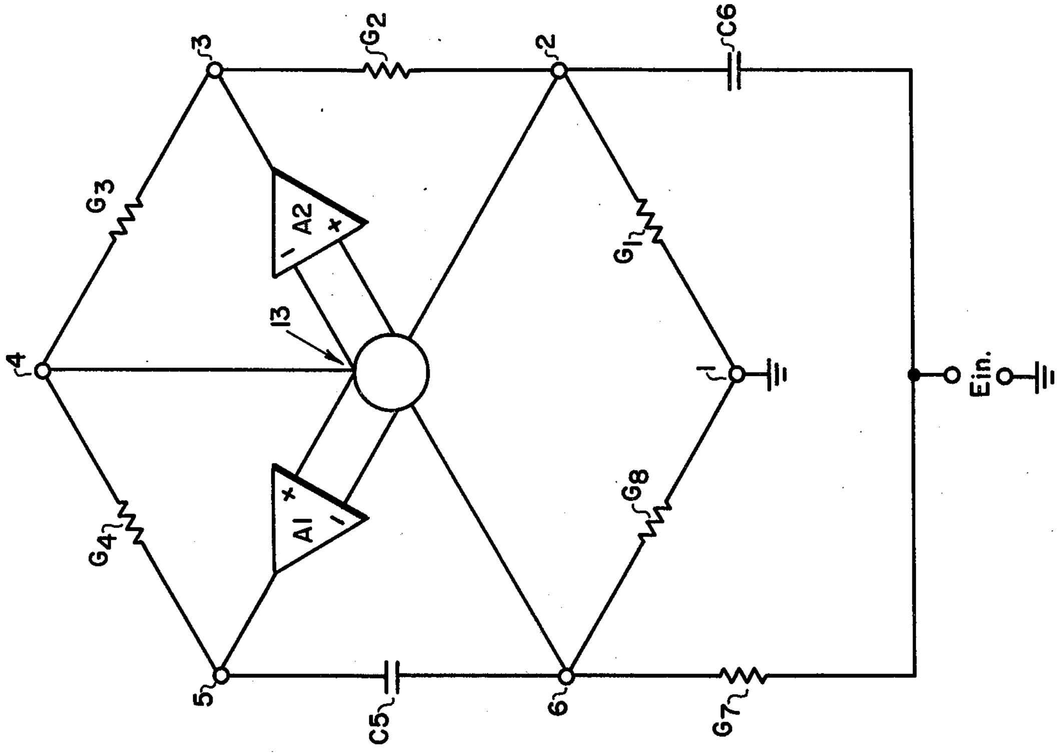
FIG. 4 is a schematic diagram similar to FIG. 3 but modified to provide a general non-minimum phase filter.
Figure 3:
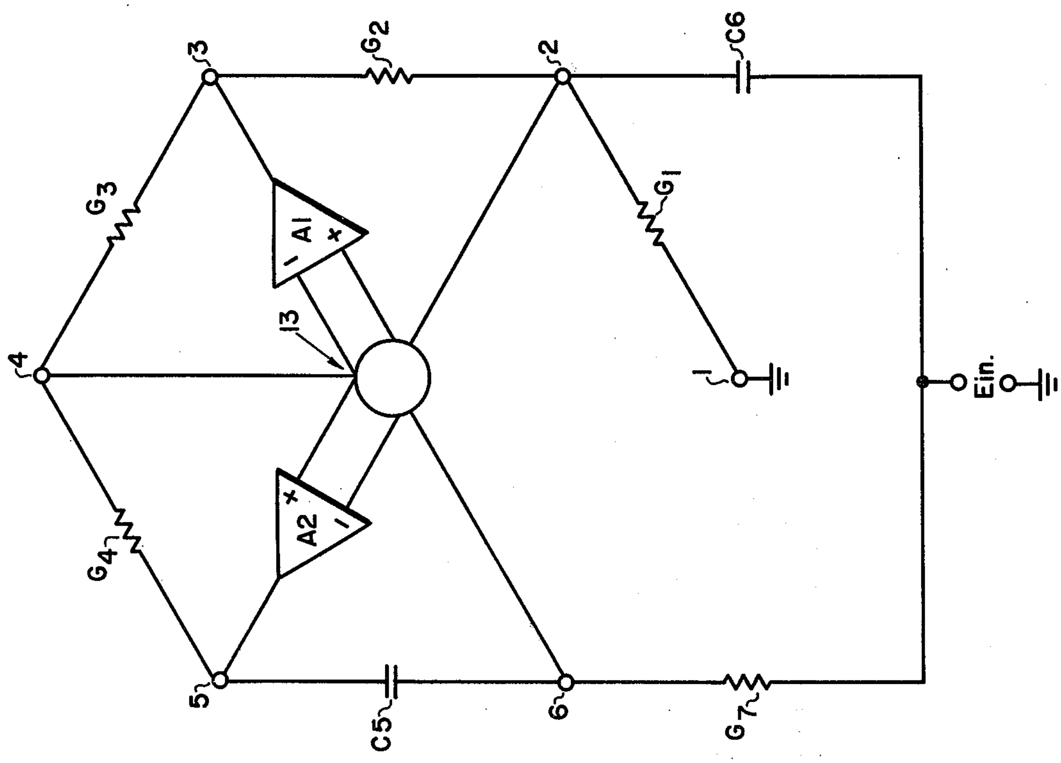
FIG. 3 is a schematic diagram of a refinement of the circuit providing a dual notch lowpass and highpass filter.

A preferred refinement of the filter configuration is illustrated in FIG. 3 where admittances Y1, Y2, Y3, Y4, and Y7 comprise conductances $g1$, $g2$, $g3$, $g4$, and $g7$, respectively, and admittances Y5 and Y6 comprise capacitors C5 and C6, respectively. Twenty-four permutations of the connections of the inputs of amplifiers A1 and A2 to nodes 2, 4 and 6 are possible. Some of these permutations, however, will be unstable when amplifiers A1 and A2 are not ideal; and because such ideal operational amplifiers are not obtainable, account must be taken for instability. Out of the 24 possible permutations for the connections of the amplifier inputs, as generally denoted by circuit means 13, three are unconditionally stable, whilst the others are either conditionally stable or unstable. The generalized refined filter of FIG. 3 may be simply converted to a general non-minimum-phase filter by the addition of conductance $g8$ between nodes 1 and 6, as illustrated in FIG. 4.

Figure 6:
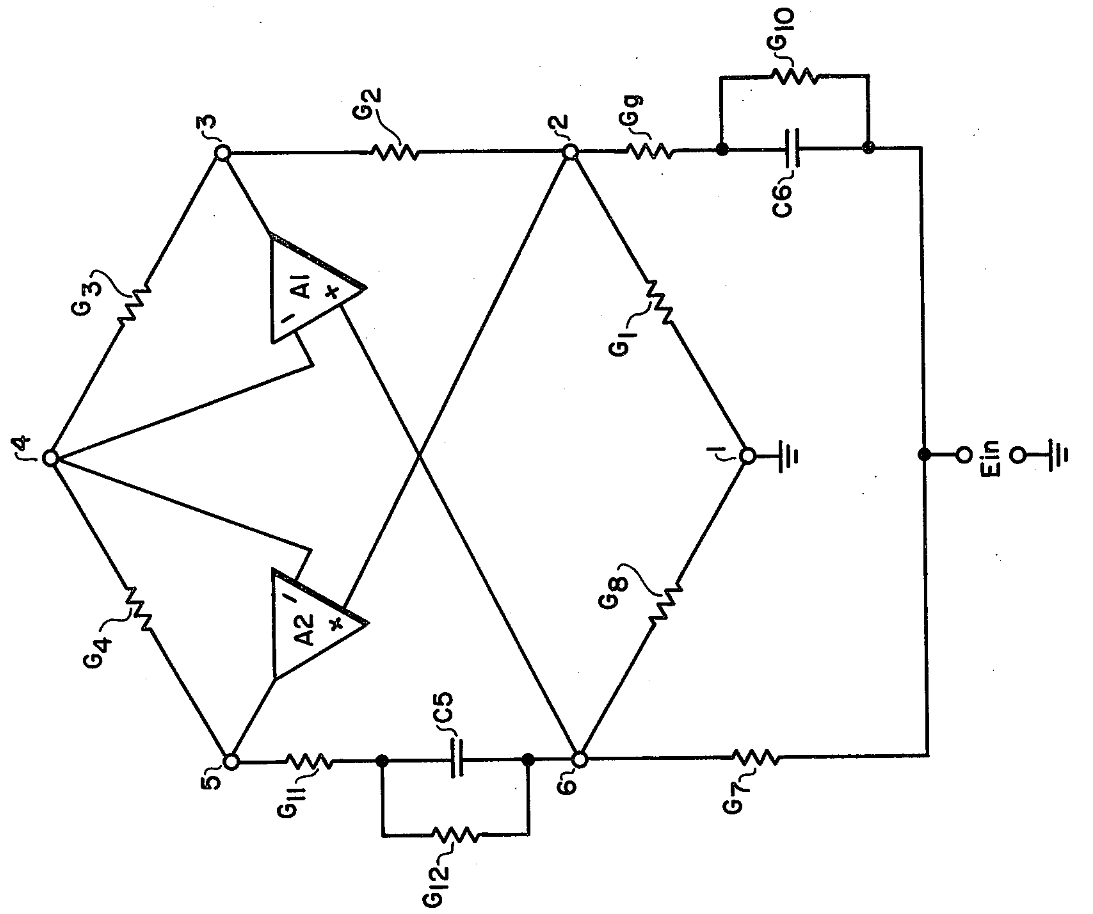
FIG. 6 is a schematic diagram of a filter configuration similar to FIG. 5 but modified to provide a general non-minimum phase filter.
Figure 5:
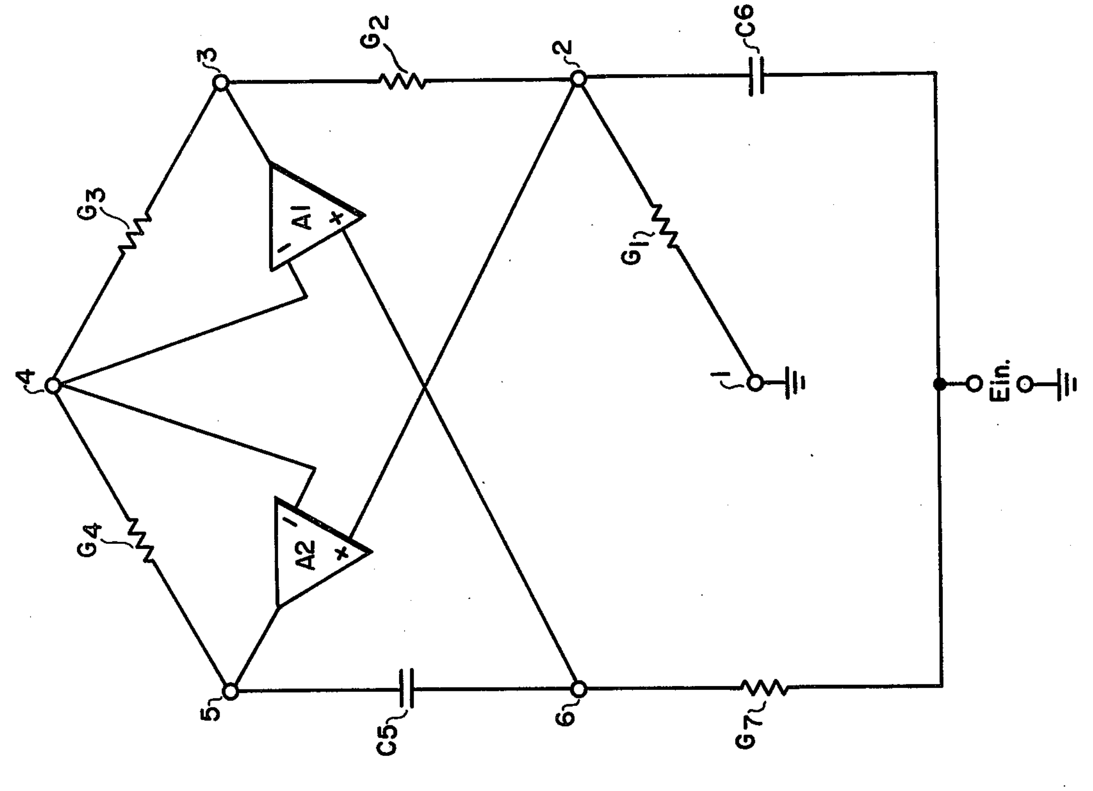
FIG. 5 is a schematic diagram of a preferred dual notch species of the present invention.

A preferred connection of the amplifier inputs is illustrated in FIG. 5. The inverting input of amplifiers A1 and A2 are both connected to node 4. The non-inverting input of amplifier A1 is connected to node 6; and the non-inverting input input of amplifier A2 is connected to node 2. Individual or simultaneous low-pass and highpass notch output voltages are provided at nodes 3 and 5. This same configuration may be converted as above explained and as shown in FIG. 6, to a general non-minimum-phase filter by the addition of admittance $g8$ between nodes 1 and 6. It may also be desirable to add conductances such as $g9$ and $g10$ in combination with capacitor C6; and conductances $g11$ and $g12$ in combination with capacitor C5, as illustrated. The addition of these resistors can compensate for the effect of non-ideal amplifiers in that the attenuation pole can be returned to the $j\omega$ axis.

Figure 8:
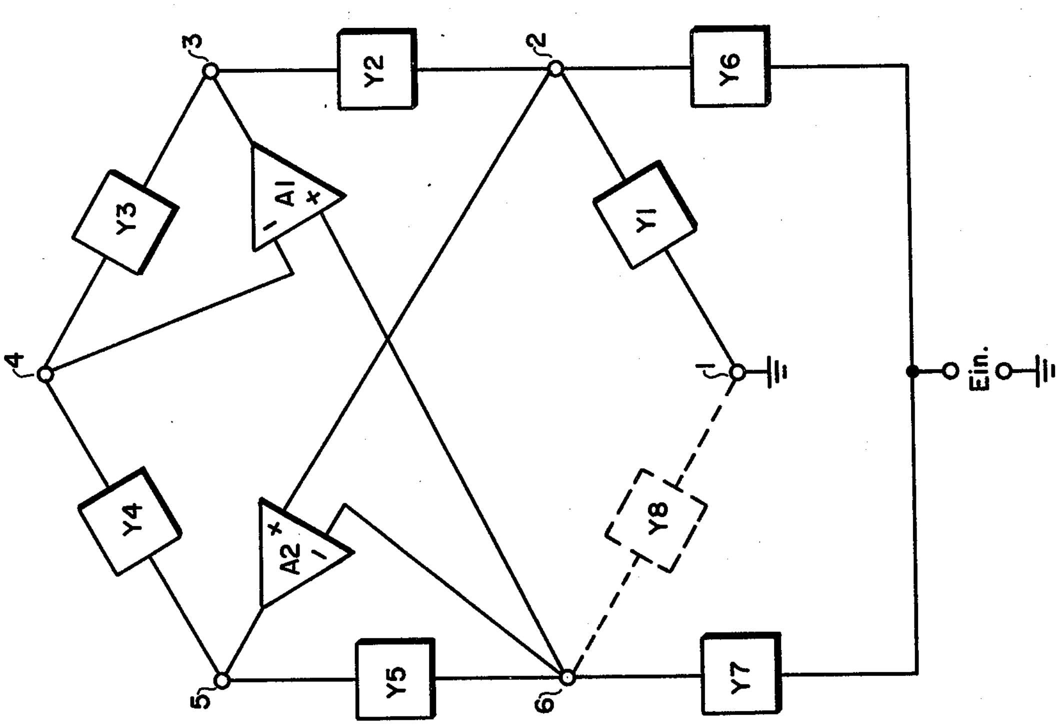
FIGS. 7, 8 and 9 are schematic diagrams of further modified forms of the dual notch filter of the present invention.
Figure 7:
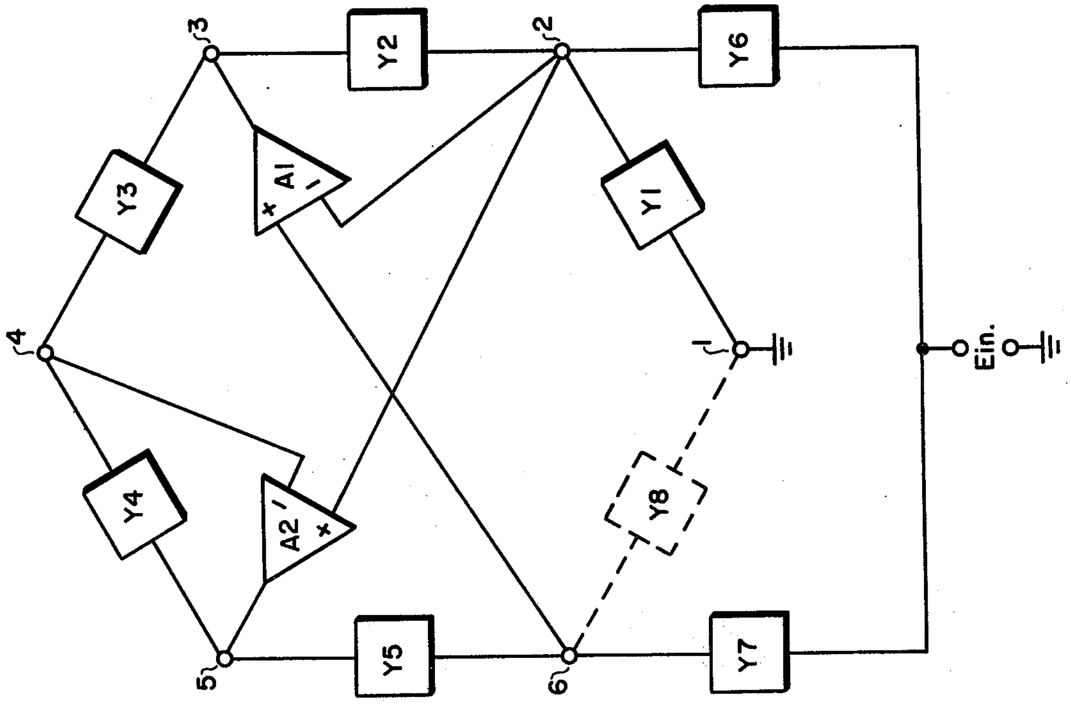

Two other unconditionally stable configurations are illustrated in FIGS. 7 and 8. In the filter shown in FIG. 7, the inverting inputs of amplifiers A1 and A2 are connected to nodes 2 and 4, respectively, and the noninverting inputs of amplifiers A1 and A2 are connected to nodes 6 and 2, respectively. This filter may be converted as above explained to provide a general non-minimum-phase biquadratic filter by the connection of an eighth admittance Y8 between nodes 1 and 6, as indicated in dashed lines in FIG. 7. The configuration of FIG. 7 is particularly suited, by reason of low sensitivity to amplifier imperfections, for use as a bandpass filter. In such case, admittances Y1 and Y3 are capacitors. The output terminal is taken at node 5. All of the other admittances are conductances with admittance 7 being open circuit or a conductance of zero value. In the filter illustrated in FIG. 8, the inverting inputs of amplifiers A1 and A2 are connected to nodes 4 and 6, respectively, and the non-inverting inputs of amplifiers A1 and A2 are connected to nodes 6 and 2, respectively. This filter may be converted to a general non-minimum-phase biquadratic filter by the addition of an eighth admittance Y8 connected between nodes 1 and 6, as indicated in dashed lines.

Figure 9:
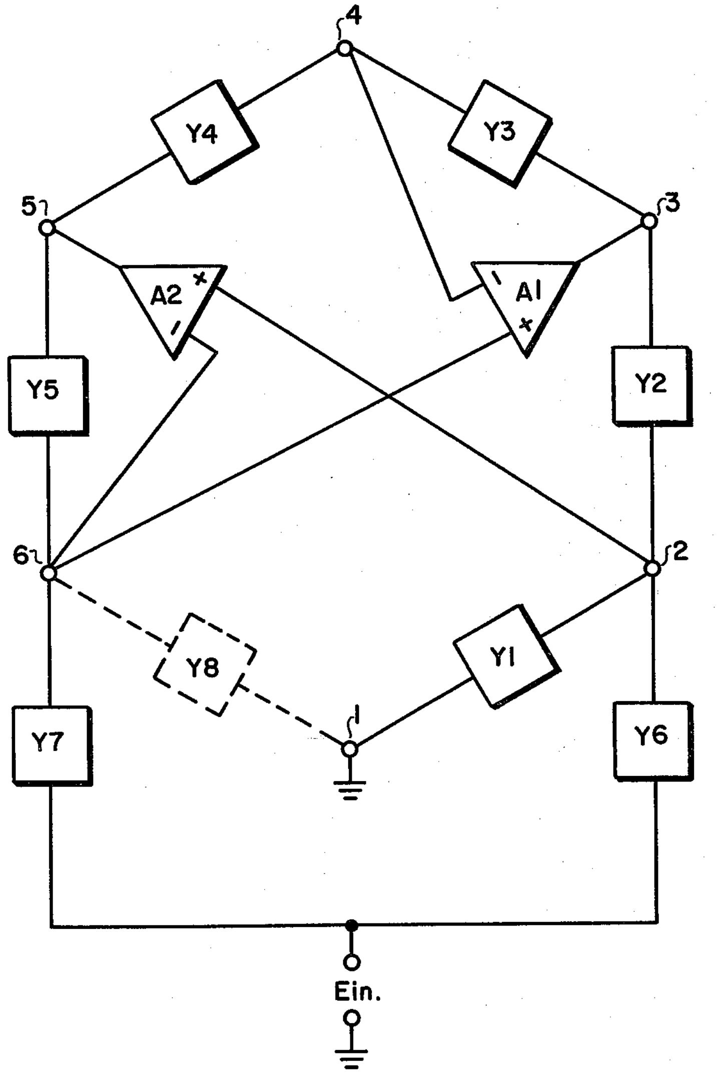

The configuration shown in FIG. 9 is conditionally stable, but has the advantage that a resistor placed across a capacitor at Y6 can compensate, as above explained, for non-ideal amplifiers. In this embodiment, as in the earlier described embodiments, including those shown in FIGS. 7 and 8, the lowpass notch output is obtainable at node 3 and a highpass notch output is simultaneously obtainable at node 5. This filter may be converted to provide a general nonminimum-phase biquadratic filter by the addition of an eighth admittance between nodes 1 and 6, as shown in dashed lines.

What is claimed is:

1. An active filter configuration having six nodes comprising:

a first admittance connected between a first and second of said nodes;

a second admittance connected between said second and third of said nodes;

a third admittance connected between said third and fourth of said nodes:

a fourth admittance connected between said fourth and fifth of said nodes;

a fifth admittance connected between said fifth and sixth of said nodes;

a voltage input terminal adapted for connection to an input voltage source having a common reference;

a sixth admittance connected between said input terminal and said second node;

a seventh admittance connected between said input terminal and said sixth node;

each of said admittances comprising an RC two terminal network;

a first differential input amplifier having an output connected to said third node;

a second differential input amplifier having an output connected to said fifth node;

circuit means connecting the inputs of said amplifier to said second, fourth and sixth nodes;

said configuration providing a filter output terminal at one of nodes three and five for a filter output voltage having a common reference;

said first node being connected to said common reference; and at least two of said admittances each containing a capacitor.

2. The filter circuit of claim 1, and an eighth admittance connected between said first and sixth nodes and providing a general non-minimum-phase biquadratic filter.

3. The filter circuit of claim 1, said first, second, third, fourth and seventh admittances each comprising a conductance;

said fifth and sixth admittances each comprising a capacitor;

said third node providing a lowpass output port;

said fifth node comprising a highpass output port.

4. The filter circuit of claim 3, and an admittance connected between said first and sixth nodes providing a general non-minimum-phase biquadratic filter.

5. The filter circuit of claim 3, the inverting and non-inverting inputs of said first amplifier being connected to said fourth and sixth nodes respectively; and the inverting and non-inverting inputs of said second amplifier being connected to said fourth and second nodes respectively.

6. The filter circuit of claim 2, the inverting and non-inverting inputs of said first amplifier being connected to said fourth and sixth nodes respectively; and the inverting and non-inverting inputs of said second amplifier being connected to said fourth and second nodes respectively.

7. The filter circuit of claim 4, the inverting and non-inverting inputs of said first amplifier being connected to said fourth and sixth nodes respectively; and the inverting and non-inverting inputs of said second amplifier being connected to said fourth and second nodes respectively.

8. The filter circuit of claim 5, said fifth and sixth admittances each comprising conductances in combination with said capacitors.

9. The filter circuit of claim 1, the inverting and non-inverting inputs of said first amplifier being connected to said second and sixth nodes respectively; and the inverting and non-inverting inputs of said second amplifier being connected to said fourth and second nodes respectively.

10. The filter circuit of claim 9, and an eighth admittance connected between said first and sixth nodes providing a general non-minimum-phase biquadratic filter.

11. The filter of claim 3, the inverting and non-inverting inputs of said first amplifier being connected to said second and sixth nodes respectively; and the inverting and non-inverting inputs of said second amplifier being connected to said fourth and second nodes respectively.

12. A bandpass filter as defined in claim 9, said first and third admittances each comprising a capacitor, said second, fourth, fifth, sixth and eighth admittances each comprising a conductance, and said seventh admittance being of zero value; and said output terminal being at node (5).

13. The filter circuit of claim 1, the inverting and non-inverting inputs of said first amplifier being connected to said fourth and sixth nodes respectively; and the inverting and non-inverting inputs of said second amplifier being connected to said sixth and second nodes respectively.

14. The filter circuit of claim 13, and an eighth admittance connected between said first and sixth nodes and providing a general non-minimum-phase biquadratic filter.

15. The filter circuit of claim 3, the inverting and non-inverting inputs of said first amplifier being connected to said fourth and sixth nodes respectively; and the inverting and non-inverting inputs of said second amplifier being connected to said sixth and second nodes respectively.

16. The filter circuit of claim 1, the inverting and non-inverting inputs of said first amplifier being connected to said fourth and second nodes respectively; and the inverting and non-inverting inputs of said second amplifier being connected to said sixth and second nodes respectively.

17. The filter circuit of claim 16, and an eighth admittance connected between said first and sixth nodes and providing a general non-minimum-phase biquadratic filter.

18. The filter circuit of claim 3, the inverting and non-inverting inputs of said first amplifier being connected to said fourth and second nodes respectively; and the inverting and non-inverting inputs of said second amplifier being connected to said sixth and second nodes respectively.

* * * * *

UNITED STATES PATENT OFFICE
CERTIFICATE OF CORRECTION

PATENT NO. : 3,881,158

DATED : April 29, 1975

INVENTOR(S) : Henry J. Orchard & Charles E. Schmidt

It is certified that error appears in the above-identified patent and that said Letters Patent are hereby corrected as shown below:

Column 1, line 65, $(Vin/Vout)=(a_o + a_1 s + s^2/b_o + s^2)$ should read -- $Vin/Vout = (a_o + a_1 s + s^2)/(b_o + s^2)$ --.

Column 2, line 17, "impedence" should read -- impedance --; same column 2, line 64, "sixith" should read -- sixth --.

Column 6, line 9, the parentheses around the numeral 5 following the word "node" should be removed to make it read -- node 5 --.

Signed and Sealed this

*twenty-sixth* Day of *August 1975*

[SEAL]

*Attest:*

RUTH C. MASON
*Attesting Officer*

C. MARSHALL DANN
*Commissioner of Patents and Trademarks*